US008483997B2

(12) United States Patent
Li et al.

(10) Patent No.: US 8,483,997 B2
(45) Date of Patent: Jul. 9, 2013

(54) PREDICTIVE MODELING OF CONTACT AND VIA MODULES FOR ADVANCED ON-CHIP INTERCONNECT TECHNOLOGY

(75) Inventors: Xia Li, San Diego, CA (US); Wei Zhao, San Diego, CA (US); David Bang, San Diego, CA (US); Yu Cao, San Diego, CA (US); Seung H. Kang, San Diego, CA (US); Matthew Nowak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 787 days.

(21) Appl. No.: 12/493,110

(22) Filed: Jun. 26, 2009

(65) Prior Publication Data
US 2010/0057411 A1    Mar. 4, 2010

Related U.S. Application Data

(60) Provisional application No. 61/075,923, filed on Jun. 26, 2008, provisional application No. 61/076,011, filed on Jun. 26, 2008, provisional application No. 61/078,964, filed on Jul. 8, 2008, provisional application No. 61/151,634, filed on Feb. 11, 2009.

(51) Int. Cl.
*G06F 7/60* (2006.01)
(52) U.S. Cl.
USPC .......................................................... 703/2
(58) Field of Classification Search
USPC .......................................................... 703/2
See application file for complete search history.

(56) References Cited

U.S. PATENT DOCUMENTS

| 7,124,378 | B2 * | 10/2006 | Matsuzawa ................... 716/111 |
| 7,308,662 | B2 | 12/2007 | Goren et al. |
| 7,831,941 | B2 * | 11/2010 | Chidambarrao et al. ..... 716/136 |
| 2006/0015276 | A1 | 1/2006 | Goren et al. |
| 2007/0044063 | A1 * | 2/2007 | Faour .............................. 716/16 |
| 2007/0109003 | A1 | 5/2007 | Shi et al. |
| 2008/0313586 | A1 * | 12/2008 | Takaki ............................. 716/5 |
| 2009/0173516 | A1 * | 7/2009 | Burke et al. ............... 174/126.1 |
| 2009/0199139 | A1 | 8/2009 | White et al. |
| 2009/0327983 | A1 | 12/2009 | Li et al. |

FOREIGN PATENT DOCUMENTS

WO    WO9901900 A1    1/1999

OTHER PUBLICATIONS

2008 Focus ITWG Tables. 32 pages. www,itrs.net/links/2008ITRS/Update/2008Tables_FOCUS_8.xls.
Aditya, Bipul and Kaushik, "An Analytical Fringe Capacitance Mode for Interconnects Using Conformal Mapping" 0278-0070, IEEE Transactions on Computer-Aided Design of Integrated Circuits and Systems, vol. 25. No. 12, Dec. 2006, p. 2765-2774.

(Continued)

*Primary Examiner* — Kamini S Shah
*Assistant Examiner* — Juan Ochoa
(74) *Attorney, Agent, or Firm* — Linda G. Gunderson

(57) ABSTRACT

A computer program product estimates performance of a back end of line (BEOL) structure of a semiconductor integrated circuit (IC). Code executes on a computer to dynamically predict an electrical resistance of the BEOL structure based on input data specific to multiple layers of the BEOL structure. The BEOL structure can be a contact or a via. The layers of the contact/via include an inner filling material and an outer liner. The code accounts for a width scatter effect of the inner filling material, as well as a slope profile of the contact/via.

15 Claims, 5 Drawing Sheets

OTHER PUBLICATIONS

Anonymous: "New Parasitic Capacitance Modeling in Hipex-C" Simulation Standard vol. 15, No. 3, Mar. 1, 2005, pp. 4-6, XP002564617; Retrieved from the Internet: URL:http://www.si 1vaco.fr/tech_li b/si mulati onstandard/2005/mar/a2/mar05_a2. pdf>[retrieved on Dec. 4, 2009] p. 5-p. 6.

Arora N D: "Modeling and characterization of copper interconnects for SoC design" Simulation of Semiconductor Processes and Devices, 2003. SISPAD 2003. International Conference on Sep. 3-5, 2003, Piscataway, NJ, USA,IEEE, Sep. 3, 2003, pp. 1-6, XP010658811; ISBN: 978-0-7803-7826-1.

Arora N D: "Modeling and characterization of copper interconnects for SoC design" Simulation of Semiconductor Processes and Devices, 2003. SISPAD 2003. International Conference on Sep. 3-5, 2003, Piscataway, NJ, USA,IEEE, Sep. 3, 2003, pp. 1-6, XP010658811 ISBN: 978-0-7803-7826-1.

Barke, "Line-to-Ground Capacitance Calculations for VLSI: A Comparison," 0278-0070/88/0200-0295 1988 IEEE, IEEE Transactions on Computer-Aided-Design, vol. 7, No. 2, Feb. 1988, p. 295-298.

Chang, "Analytical IC Metal-Line Capacitance Formulas," IEEE Transactions on Microwave Theory and Techniques, Sep. 1976, p. 808-811.

Cheng, Y.L; Wang, Y.L; Chen, H.C.; "Extraction of effective dielectric constants and the effect of process damage of low-k dielectrics for advanced interconnects," Sep. 26, 2006, Elsevier.

Elmasry, "Capacitance Calculations MOSFET VLSI," 0193-6578/82/0100-0006 1981, IEEE Electron Device Letters, vol. EDL-3, No. 1. Jan. 1982, p. 6-7.

Gosset et al: "Advanced Cu interconnects using air gaps" Microelectronic Engineering, Elsevier Publishers Bv., Amsterdam, NL, vol. 82, No. 3-4, Dec. 1, 2005, pp. 321-332, XP005183023; ISSN: 0167-9317.

International Search Report—PCT/US2009/047668, International Search Authority—European Patent Office Feb. 9, 2010.

International Technology Roadmap for Semiconductors 2007 Edition Interconnect 67 pages.

Invitation to Pay Additional Fees—PCT/US2009/047668, International Search Authority—European Patent Office—Oct. 30, 2009.

Kaustav Banerjee et al: "3-D ICs: A Novel Chip Design for Improving Deep- Submicrometer Interconnect Performance and Systems-on-Chip Integration" Proceedings of the IEEE, IEEE. New York, US, vol. 89, No. 5, May 1, 2001, XP011044501 ISSN: 0018-9219.

Kaustav Banerjee et al: "3-D ICs: A Novel Chip Design for Improving Deep-Submicrometer Interconnect Performance and Systems-on-Chip Integration" Proceedings of the IEEE, IEEE. New York, US, vol. 89, No. 5, May 1, 2001, XP01104450; ISSN: 0018-9219.

Kong J-T: "CAD for Nanometer Silicon Design Challenges and Success" IEEE Transactions on Very Large Scale Integration (VLSI) Systems, IEEE Service Center, Piscataway, NJ, US, vol. 12, No. 11, Nov. 1, 2004, pp. 1132-1147, XP011121258 ISSN: 1063-8210.

Kong J-T: "CAD for Nanometer Silicon Design Challenges and Success" IEEE Transactions on Very Large Scale Integration (VLSI) Systems, IEEE Service Center, Piscataway, NJ, US, vol. 12, No. 11, Nov. 1, 2004, pp. 1132-1147, XP011121258; ISSN: 1063-8210.

Liang Choo Hsia et al: "BEOL Advance Interconnect Technology Overview and Challenges" VLSI Technology, Systems and Applications, 2008. VLSI-TSA 2008. International Symposium On, IEEE, Piscataway, NJ, USA, Apr. 21, 2008, pp. 28-29, XP031258800; ISBN: 978-1-4244-1614-1.

Nabors and White, "FastCap A Multipole Accelerated 3-D Capacitance Extraction Program," 0278-0070/91/1100-1447 1991 IEEE, IEEE Transactions Computer-Aided Design, vol. 10 No. 11, Nov. 1991, p. 1447-1459.

Qi, Xiaoning; Wang, Gaofeng; Yu Zhiping; Dutton, Robert; "On-Chip Inductance Modeling and RLC Extraction of VLSI Interconnects for Circuit Simulation," May 2000, IEEE.

Sakurai and Tamaru, "Simple Formulas for Two- and Three-Dimensional Capacitances," Briefs, 0018-0383/83/0200-0183 IEEE, IEEE Transactions on Electron Device. vol. ED-30, No. 2, Feb. 1983, p. 153-155.

Sakurai, "Closed-Form Expression for Interconnection Delay, Coupling, and Crosstalk in VLSI's," 0018-9383/93 1993 IEEE, IEEE Transactions on Electron Devices, vol. 40, No. 1, Jan. 1993, p. 118-I24.

Wong, Lee and Ma, "Modeling of interconnect Capacitance, Delay and Crosstalk in VLSI," 0894-6507/00 2000 IEEE, IEEE Transactions on Semiconductor Manufacturing, vol. 13, No. 1, Feb. 2000, p. 108-111.

Wong, Lee, Ma. and Chao, "An Empirical Three-Dimensional Crossover Capacitance Model for Multilevel Interconnect VLSI Circuits," 0894-6507700 2000 IEEE, IEEE Transactions on Semiconductor Manufacturing, vol. 13, No. 2, May 2000, p. 219-227.

Written Opinion—PCT/US2009/047668, International Search Authority—European Patent Office Feb. 9, 2010.

Youssef Travaly et al: "On a More Accurate Assessment of Scaled Copper/Low-k Interconnects Performance" IEEE Transactions on Semiconductor Manufacturing, IEEE Service Center, Piscataway, NJ, US, vol. 20, No. 3, Aug. 1, 2007, pp. 333-340, XP011189526 ISSN: 0894-6507.

Yuan and Trick, "A Simple Formula for the Estimation of Capacitance of Two-Dimensional Interconnects in VLSI Circuits," 0193-8587/82/1200-039 1982 IEEE, IEEE Electron Device Letters, vol. EDL-3, No. 12, Dec. 1962, p. 391-393.

Zhao and Cad, "New Generation of Predictive Technology Model for Sub-45nm Early Design Exploration," 0018-9383 2006 IEEE, IEEE Transaction on Electron Devices, vol. 53, No. 11, Nov. 2006, p. 2816-2823.

Zhao, Li, Nowak and Cao, "Predictive Technology modeling for 32nm Low Power Design," ISDRS 2007—http://www.ece.emd.edu/ISDRS, Dec. 12-14, 2007, College Park, MD, USA, Student Paper. Department of Electrical Engineering, Arizona State University, Tempe, USA.

Rossnagel, et. al, "Alteration of Cu conductivity in the size effect regime," Journal of Vacuum Science & Technology B: Microelectronics and Nanometer Structures, 2004, pp. 240-247.

Schindler, et. al, "Recent Advances for Nano Interconnects: Conductor Reliability and Resistivity," Conference Proceedings ULSI XVIII, 2003, pp. 13-19.

Synopsys Data Sheet, "Raphael Interconnect Analysis Tool", p. 1-4, 2006 Synopsys, Inc. All rights reserved. 03/06.Rb.WO.05-13757.

* cited by examiner

PREDICTIVE MODELING OF CONTACT AND VIA MODULES FOR ADVANCED ON-CHIP INTERCONNECT TECHNOLOGY

CROSS-REFERENCE TO RELATED APPLICATIONS

This application claims the benefit of U.S. Provisional Application. No. 61/075,923, filed Jun. 26, 2008, entitled "Predictive Modeling and Methodology of Contact and Via Modules for Advanced On-Chip Interconnect Technology," U.S. Provisional Patent Application No. 61/076,011, filed Jun. 26, 2008, entitled "Predictive Modeling and Methodology of Interconnect Modules for Advanced On-Chip Interconnect Technology," U.S. Provisional Patent Application No. 61/078,964, filed Jul. 8, 2008, and U.S. Provisional Patent Application No. 61/151,634, filed Feb. 11, 2009, the disclosures of which are expressly incorporated by reference herein in their entireties.

TECHNICAL FIELD

The present disclosure generally relates to semiconductor technology. More specifically, the present disclosure relates to predicting electrical characteristics of semiconductor components, such as on-chip contact or via technology.

BACKGROUND

Interconnect technology, such as contacts and vias, has become increasingly important for designing integrated circuits (ICs) (also referred to as chips). Interconnects are part of the back-end-of-the-line (BEOL) processing in multi-layered semiconductor devices. On-chip interconnect technology distributes clock and data signals as well as power and ground signals to various functional blocks in an IC. As the IC designs become smaller and more compact, the size, dimensions, materials, and positioning of interconnect structures become increasingly significant factors in overall performance.

As seen in FIG. 2, front end of line (FEOL) processing results in semiconductor components 20, such as transistor elements (e.g., gates), on a semiconductor substrate. Back end of line (BEOL) processing results in BEOL structures, such as contacts 22, and vias 24, 26, as well as conductive layers M1, M2, M3 including conductive traces.

The contact and via resistances become a growing concern as device dimensions continue to shrink, where they are a significant fraction of the total local line resistance. As such, the delay associated with the signals traveling through the contacts and vias becomes a significant portion of the overall delay of the local interconnection of the IC.

Modeling tools are used by IC designers to estimate the resistance properties of complex interconnect systems, including structures such as the contact and via. Conventional modeling tools perform high-level simulations using finite element method calculations for the interconnect structure. However, existing modeling tools measure models of the contacts and vias based on average resistivity, thus providing an incomplete assessment of the total resistance.

Another characteristic of existing modeling tools is their requirement to recreate a simulation environment for a different technology node. Since existing modeling tools conventionally extract coefficients from existing silicon data (i.e., the coefficients are dependent on the physical dimensions), it is difficult to skew and scale with physical dimensions because the coefficients are restricted to simulating the contacts and vias for only a specific technology node and specific dimensions.

Further, employing existing modeling tools to extract resistance results occurs late in the development cycle, because the actual silicon data is available towards the end of the development cycle. As a result, changes to designs based on the results from the modeling tools delay the development cycle.

For the foregoing reasons, there is a need for providing a more physical scalable and accurate model of contacts and vias earlier in the development cycle.

SUMMARY

The present disclosure is directed to a computer software program that satisfies the need of providing a more physical, scaleable and accurate model of the contact/via earlier in the development cycle than conventional projections. In accordance with the present disclosure, the computer software program provides performance predictions in future technology generations based on a relationship between a model and existing wafer data by deriving values of the model's coefficients using the existing wafer data. The computer software program begins execution of a method to model an on-chip interconnect by providing physical dimensions of a contact/via in an existing semiconductor wafer for an existing technology node. The physical dimensions of the contact/via provide a starting point in developing a model of the contact/via. The information about the physical dimensions can be entered into a third party interconnect analysis tool, such as the RAPHAEL tool by SYNOPSYS. This tool simulates the contact/via as developed in the existing semiconductor wafer and extracts specific measurements about its electrical characteristics, such as resistance data.

The method includes generating the model, which is provided by a set of equations defining a possible contact/via similar to the contact/via in the existing wafer. The set of equations include computations of scattering effects that increase resistivity as device dimensions shrink. The set of equations also include information about the angular shape of the possible contact/via. More importantly, the model can predict both the physical dimensions and performance of the possible contact/via across multiple technology nodes. The set of equations includes a set of coefficients, which can be configured as constant factors that allows the model to be employed constantly across multiple technology nodes. In other words, the model can analytically represent the possible contact/via in more than one technology node by accepting multiple physical dimension inputs without the need of recreating the simulation environment.

In one aspect, a computer program product estimates performance of a back end of line (BEOL) structure of a semiconductor integrated circuit (IC). The computer program product is tangibly stored on a computer-readable medium, and includes code executing on a computer to dynamically predict an electrical resistance of the BEOL structure based on input data specific to multiple layers of the BEOL structure.

In another aspect, a system estimates performance of a BEOL structure of a semiconductor integrated circuit (IC). The system includes means for dynamically predicting resistance of the BEOL structure based on input data specific to multiple layers of the BEOL structure.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is made to the following description taken in conjunction with the accompanying drawings.

DETAILED DESCRIPTION

A detailed description of one or more embodiments is provided below along with accompanying figures that illustrate the principles of the embodiments. The scope of the embodiments is limited only by the claims and encompasses numerous alternatives, modifications and equivalents. Numerous specific details are set forth in the following description. These details are provided solely for the purposes of example and the embodiments may be practiced according to the claims without some or all of these specific details.

Figure 1:
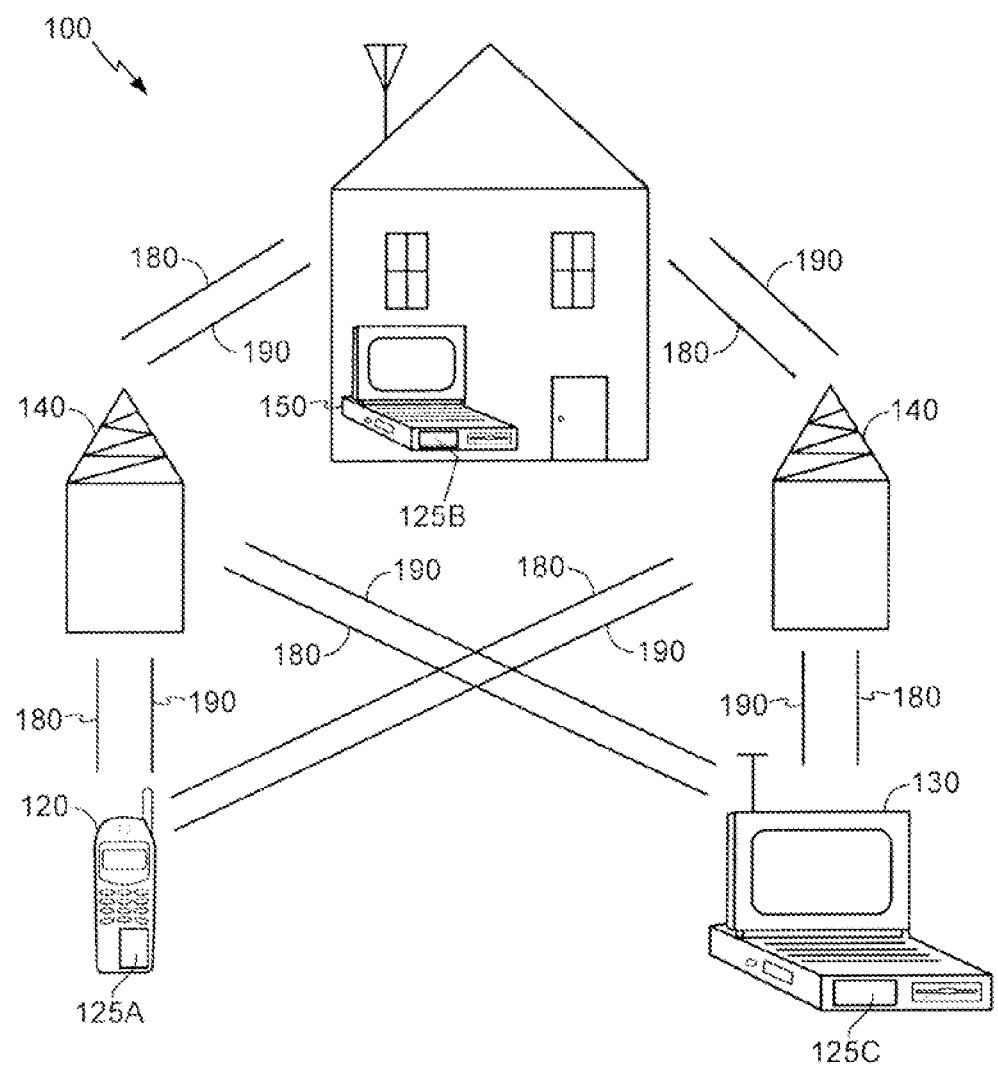
FIG. 1 is a block diagram showing an exemplary wireless communication system.
Figure 2:
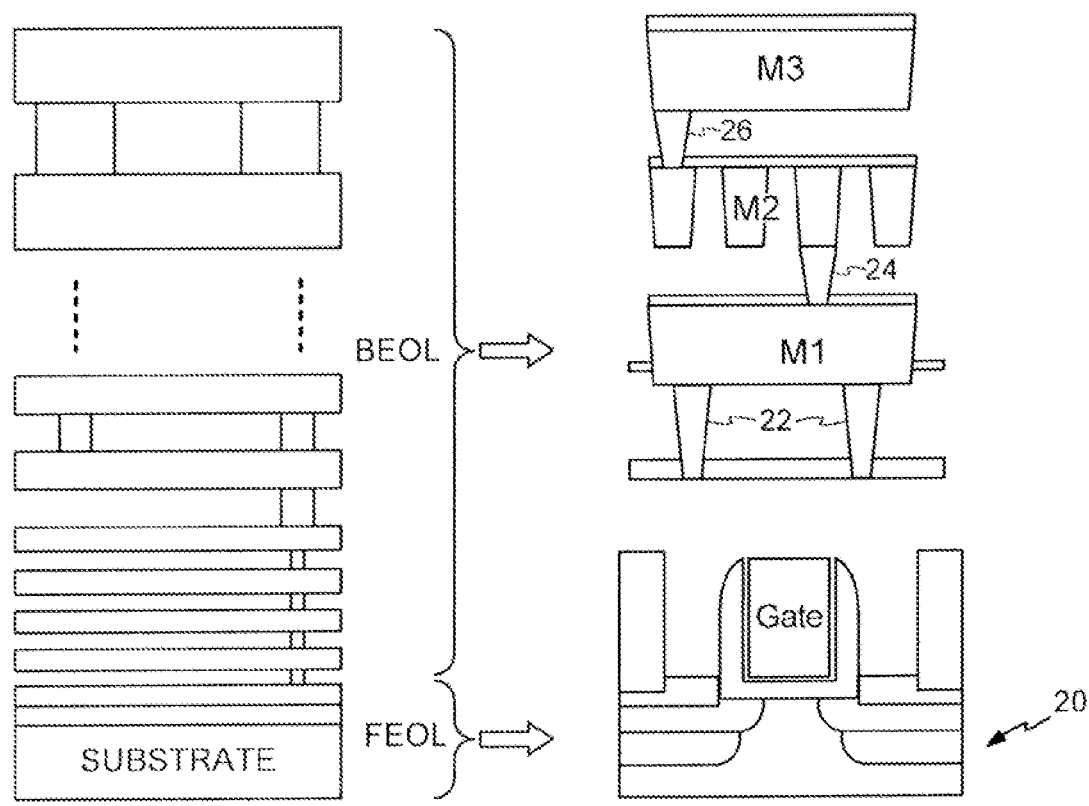
FIG. 2 is a block diagram showing complementary metal oxide semiconductor (CMOS) front end of line (FEOL) and back end of line (BEOL) portions.

FIG. 1 shows an exemplary wireless communication system 100 in which an embodiment of the disclosure may be advantageously employed. For purposes of illustration, FIG. 1 shows three remote units 120, 130, and 150 and two base stations 140. It will be recognized that conventional wireless communication systems may have many more remote units and base stations. Remote units 120, 130, and 150 include semiconductor devices 125A, 125B and 125C, which are embodiments of the disclosure as discussed further below. FIG. 1 shows forward link signals 180 from the base stations 140 and the remote units 120, 130, and 150 and reverse link signals 190 from the remote units 120, 130, and 150 to base stations 140.

In FIG. 1, a remote unit 120 is shown as a mobile telephone, a remote unit 130 is shown as a portable computer, and a remote unit 150 is shown as a fixed location remote unit in a wireless local loop system. For example, the remote units may be mobile phones, hand-held personal communication systems (PCS) units, portable data units such as personal data assistants, navigation devices (such as GPS enabled devices), set top boxes, music players, video players, entertainment units, fixed location data units such as meter reading equipment, or any other device that stores or retrieves data or computer instructions, or any combination thereof. Although FIG. 1 illustrates remote units according to the teachings of the disclosure, the disclosure is not limited to these exemplary illustrated units. Embodiments of the disclosure may be suitably employed in any device which includes integrated circuitry and associated interconnect technology.

The foregoing disclosed devices and methods are commonly designed and configured into a hardware description language, such as VHDL and Verilog computer files, stored on a computer-readable media. These files are in turn provided to fabrication handlers who fabricate devices based on these files. The resulting products are semiconductor wafers that are then cut into semiconductor die and packaged. The packaged die are employed in the devices described above.

Figure 3:
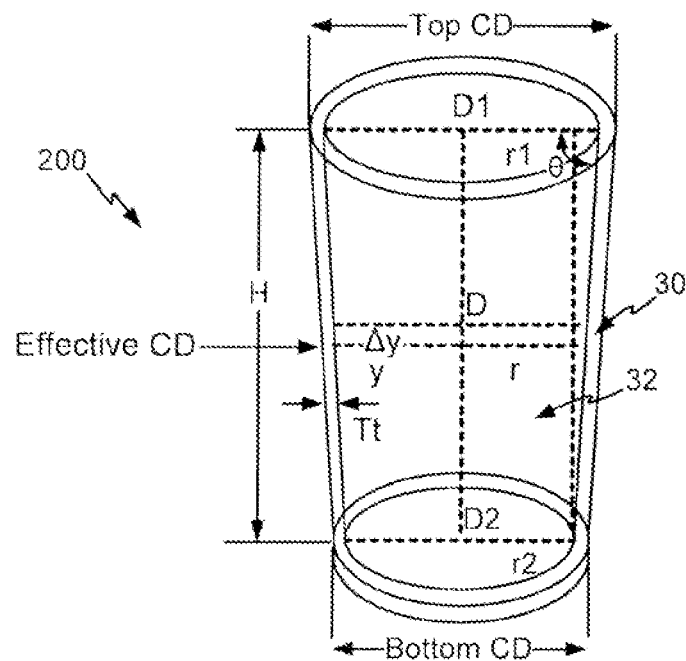
FIG. 3 is a block diagram illustrating a cross section view of an exemplary back end of line (BEOL) structure.

FIG. 3 is a block diagram illustrating across section view of an exemplary back end of line (BEOL) structure 200. The BEOL structure 200 can be a contact or a via having a generally cylindrical shape with a circular cross section. For the purposes of predicting resistance of various configurations of BEOL structures, two layers are considered: an outer liner 30, and an inner filler 32. The liner 30 is the portion of the BEOL structure 200 between the inner filler 32 (often a conductive material such as a metal) and an oxide (not shown) that acts as an isolation barrier to protect the inner filler 32 (o(ten a conductive material such as a metal).

In order to increase the accuracy of the prediction, a slope profile of the BEOL structure is considered. That is, the top radius r1 differs from the bottom radius r2, resulting in an angle θ (discussed below) that is not 90 degrees. The slope profile is associated with the angle θ.

Finally, the prediction considers the electron scattering effect of the inner filler material of the BEOL structure. Scattering effects are based upon grain size and edge roughness of the BEOL structure. As interconnects continue to shrink, the scattering effect has an increasing effect on resistivity. Thus, a model that accounts for the scatter effect is more accurate when evaluating future technology nodes. That is, whenever scaling the width of the BEOL structure, resistivity increases and the prediction reflects such increases.

The equation to determine the width dependent resistivity, $\rho_1$, is:

$$\rho_1 = \rho_{10}(1 + d_1/W) \tag{1}$$

where $\rho_{10}$ is the bulk resistivity,
$d_1$ is the normalized coefficient that relates the resistivity with the variations in width caused by scattering effects of the specific material, and
W is the width of the structure.

In the case of doped copper, equation (1) simplifies to:

$$2.1 + 32e-9/W(m)(\mu\text{-}\Omega\text{cm}) \tag{2}$$

where 2.1 is the known bulk resistivity of the doped copper material, and
W is the width of the structure.

For other materials, such as tungsten, the bulk resistivity, $\rho_{10}$, and the material coefficient, $d_1$, can be obtained from known sources.

According to an aspect of the disclosure, a model is provided for predicting contact and via resistance. The model accounts for the slope profile of the BEOL structure. To account for the slope of the BEOL structure, the angle θ is defined based upon the following equation:

$$\tan\theta = \frac{H}{r_1 - r_2} = \frac{2H}{D_1 - D_2} \quad (3)$$

where H is the height,
$r_1$ is the top radius,
$r_2$ is the bottom radius,
$D_1$ is the top diameter, and
$D_2$ is the bottom diameter.
An effective width, $CD_{eff}$, is defined as:

$$CD_{eff} = \frac{CD_{top} + CD_{bottom}}{2} \quad (4)$$

where $CD_{top}$ (also referred to as Top CD) is the top width, including the liner thickness, and
$CD_{bottom}$ (also referred to as Bottom CD) is the bottom width, including the liner thickness.
Similarly, an effective diameter, $D_{eff}$, (or D) excluding the liner thickness, and the effective radius, $r_{eff}$ is defined as:

$$D_{eff} = \frac{D_{top} + D_{bottom}}{2} \Leftrightarrow r_{eff} = \frac{r_{top} + r_{bottom}}{2} \quad (5)$$

where $D_{top}$ (or D1) is the top diameter, excluding the liner thickness,
$D_{bottom}$ (or D2) is the bottom diameter, excluding the liner thickness,
$r_{top}$ (or r1) is the top radius, excluding the liner thickness, and
$r_{bottom}$ (or r2) is the bottom radius, excluding the liner thickness.
The effective width, $CD_{eff}$, can also be defined as:

$$CD_{eff} = D_{eff} + 2T_t = 2r_{eff} + 2T_t \quad (6)$$

where $T_t$ is the liner thickness,
$D_{eff}$ is the effective diameter, and
$r_{eff}$ is the effective radius.
Inline measurement generally allows measuring of the top of a BEOL structure, whereas measuring the bottom of a BEOL structure can be difficult. Thus, in another embodiment the effective width is defined based upon the top effective width as:

$$CD_{eff} = 2(r_{eff} + T_t) = CD_t - Htg\theta \quad (6a)$$

where $r_{eff}$ is the effective radius (excluding the liner)
$T_t$ is the liner thickness,
$CD_t$ is the top effective width,
H is the height of the BEOL structure,
θ is the slope angle.
The effective width, $CD_{eff}$, or the effective diameter, $D_{eff}$, is used to model the BEOL structure, as discussed in more detail.
The width dependent resistivity, ρ1, equation (equation (1)) can be modified to be based upon the diameter, D, or the radius, r, as follows:

$$\rho_1 = \rho_{10}\left(1 + \frac{d_2}{D}\right) = \rho_{10}\left(1 + \frac{d_3}{r}\right) \quad (7)$$

where $\rho_{10}$ is the bulk resistivity,
$d_2$ the material coefficient is equal to $2d_3$,
D is the effective diameter, and
R is the effective radius.
In order to calculate the overall resistance of the BEOL structure, an inner filling material resistance, a bottom resistance, and a liner resistance should be calculated.
The inner filling material resistance calculation will now be discussed. In one embodiment, the inner material for via structures is copper, and for contact structures the material is tungsten. In order to obtain the inner filling material resistance, the bulk resistivity, $\rho_{10}$, and the width coefficient, $d_3$, corresponding to the material are determined.
In addition, an incremental inner filling resistivity, $\Delta R_1$, is defined. The incremental inner filling resistivity, $\Delta R_1$, represents a thin piece of the resistivity of the BEOL structure. An incremental distance, Δy, is also defined to enable analysis of thin cylindrical slices of the BEOL structure. The incremental inner filling resistivity, $\Delta R_1$, is defined as:

$$\Delta R_1 = \frac{\rho_1 \cdot \Delta y}{\pi r^2} \quad (8)$$
$$= \frac{\rho_1 \tan\theta \cdot \Delta r}{\pi r^2}$$
$$= \frac{\rho_{10}\left(1 + \frac{d_3}{r}\right)\tan\theta \cdot \Delta r}{\pi r^2}$$
$$= \frac{\rho_1 \tan\theta}{\pi r_{eff}^2} \Delta r$$
$$= \frac{\rho_{10}\left(1 + \frac{d_3}{r_{eff}}\right)\tan\theta}{\pi r_{eff}^2} \Delta r$$

where Δy is the incremental distance,
ρ1 is the width dependent resistivity of the inner filling material,
r is the effective radius,
θ is the slope profile angle,
Δr is defined as Δy/tan θ,
$d_3$ is the material coefficient,
$\rho_{10}$ is the bulk resistivity, and
$r_{eff}$ is the effective radius
The incremental inner filling resistivities, $\Delta R_1$, of each slice are summed by integrating over the height of the BEOL structure from the top to the bottom. It is noted that the inner filling material resistivity accounts for the surface scatter effect.
An outer liner metal resistance, $\Delta R_2$, is also defined. The outer liner metal resistance, $\Delta R_2$, does not account for any scatter effect. Such an assumption is realistic due to the fact that the liner is quite thin. Thus the width dependent resistivity, ρ2, is set equal to the bulk resistivity, $\rho_{20}$. The outer liner resistivity, $\Delta R_2$, is defined as:

$$\Delta R_2 = \frac{\rho_2 \cdot \Delta y}{\pi(r + T_t)^2 - \pi r^2} \quad (9)$$

-continued $$= \frac{\rho_2 \tan\theta \cdot \Delta r}{(\pi(r+T_t)^2 - \pi r^2)}$$

$$= \frac{\rho_2 \tan\theta \cdot \Delta r}{\pi(2r+T_t)T_t}$$

$$= \frac{\rho_2 \tan\theta}{\pi(2r_{\mathit{eff}}+T_t)T_t}\Delta r$$

where $\Delta y$ is the incremental distance,
$\rho 2$ is the width dependent resistivity,
r is the effective radius,
$T_t$ is the liner thickness,
$\theta$ is the slope profile angle,
$\Delta r$ is defined as $\Delta y/\tan\theta$, and
$r_{\mathit{eff}}$ is the effective radius.

The incremental liner resistivities, $\Delta R_2$, of each slice are summed by integrating over the height of the BEOL structure from the top to the bottom. It is noted that the liner material resistivity does not account for the surface scatter effect.

The bottom of the BEOL structure is actually a portion of the liner. Thus, the bottom liner resistance, $R_{bottom}$, is derived as:

$$R_{bottom} = \frac{\rho_2 T_t}{\pi(r_2+T_t)^2} \approx \frac{\rho_2 T_t}{\pi(r_{\mathit{eff}}+T_t)^2} \qquad (10)$$

where $\rho 2$ is the bulk resistivity (without scatter effect),
$T_t$ is the liner thickness,
$r_2$ is the bottom radius, and
$r_{\mathit{eff}}$ is the effective radius.

By integrating the incremental inner filling resistivity, $\Delta R_1$, and the outer liner resistivity, $\Delta R_2$, the effective incremental resistance, $\Delta R$, can be obtained. To calculate the effective incremental resistance, $\Delta R$. an effective liner coefficient, $d_4$, is defined as $$d_4 = \rho_{10}/\rho 2 * T_t \qquad (11)$$

where $\rho_{10}$ is the bulk resistivity,
$\rho 2$ is the liner bulk resistivity, and
$T_t$ is the liner thickness.

In order to calculate the integral, the effective incremental resistance, $\Delta R$, is defined. The effective incremental resistance, $\Delta R$, is defined as:

$$\Delta R = \frac{\Delta R_1 \cdot \Delta R_2}{\Delta R_1 + \Delta R_2} \qquad (12)$$

$$= \frac{1}{\frac{1}{\Delta R_1}+\frac{1}{\Delta R_2}}$$

$$= \frac{\rho_{10}\tan\theta}{\pi}\left[\frac{r+d_3}{r^3+d_4(2r+T_t)(r+d_3)}\right]\Delta r$$

$$= \frac{\rho_1 \tan\theta}{\pi\left(r_{\mathit{eff}}^2+(2r_{\mathit{eff}}+T_t)T_t\frac{\rho_1}{\rho_2}\right)}\Delta r$$

where $\Delta R_1$ is the inner material resistance,
$\Delta R_2$ is the outer liner resistance,
$\rho_{10}$ is the bulk resistivity,
$\theta$ is the slope profile angle,
r is the effective radius,
$T_t$ is the liner thickness,
$d_3$ is the material coefficient, $d_4 = \rho_{10}/\rho 2 * T_t$,
$\Delta r$ is defined as $\Delta y/\tan\theta$,
$r_{\mathit{eff}}$ is the effective radius,
$\rho 1$ is the inner material width dependent resistivity, and
$\rho 2$ is the liner bulk resistivity.

Figure 4:
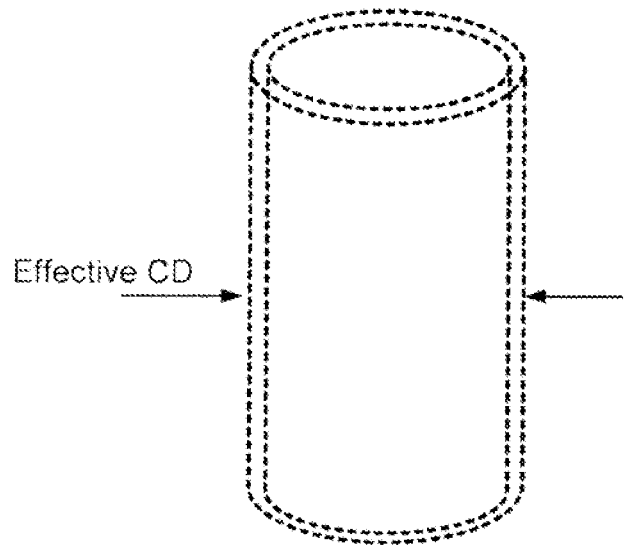
FIG. 4 is a block diagram illustrating a cross section view of an exemplary back end of line (BEOL) structure approximation.

Because of the computational complexity of integrating equation (12), a cylinder can be assumed (as seen in FIG. 4) to approximate the shape of the BEOL structure. Thus, an effective resistance, $R_{\mathit{eff}}$, based upon the cylinder approximation is defined as:

$$R = R_{\mathit{eff}} = \frac{\rho_1 H}{\pi\left(r_{\mathit{eff}}^2+(2r_{\mathit{eff}}+T_t)T_t\frac{\rho_1}{\rho_2}\right)} \qquad (13)$$

where $R_{\mathit{eff}}$ is the effective resistance
$\rho 1$ is the inner material width dependent resistivity,
H is the height of the BEOL structure,
$r_{\mathit{eff}}$ is the effective radius,
$T_t$ is the liner thickness, and
$\rho 2$ is the liner bulk resistivity.

Equation (13) can be simplified when $\rho 1$ is close to $\rho 2$, i.e., the inner width dependent resistivity, $\rho 1$, is increased to the liner bulk resistivity, $\rho 2$, as:

$$R = R_{\mathit{eff}} \approx \frac{\rho_1 H}{\pi(r_{\mathit{eff}}+T_t)^2} \qquad (14)$$

(if $\rho_1 \approx \rho_2$, inner width effect increase $\rho_1$ close to $\rho_2$)
where $R_{\mathit{eff}}$ is the effective resistance
$\rho 1$ is the inner material width dependent resistivity,
H is the height of the BEOL structure,
$r_{\mathit{eff}}$ is the effective radius, and
$T_t$ is the liner thickness.

A general total resistance of the BEOL structure can then be defined as:

$$R_{total} = R_{\mathit{eff}} + R_{bottom} \qquad (15)$$

$$= \frac{\rho_1 H}{\pi\left(r_{\mathit{eff}}^2+(2r_{\mathit{eff}}+T_t)T_t\frac{\rho_1}{\rho_2}\right)} + \frac{\rho_2 T_t}{\pi(r_2+T_t)^2}$$

where $R_{\mathit{eff}}$ is the effective resistance,
$R_{bottom}$ is the bottom liner resistance,
$\rho 1$ is the inner material width dependent resistivity,
H is the height of the BEOL structure,
$r_2$ is the bottom radius,
$T_t$ is the liner thickness, and
$\rho 2$ is the liner bulk resistivity.

Equation (15) can be simplified when the inner material width dependent resistivity, $\rho 1$, is approximately equal to the outer material bulk resistivity, $\rho 2$. The simplified equation is:

$$R_{total} = R_{\mathit{eff}} + R_{bottom} \approx \frac{4(\rho_1 H + \rho_2 T_t)}{\pi C D_{\mathit{eff}}^2} \qquad (16)$$

where $R_{\mathit{eff}}$ is the effective resistance,
$R_{bottom}$ is the bottom liner resistance,
$\rho 1$ is the inner material width dependent resistivity,
H is the height of the BEOL structure, ρ2 is the liner bulk resistivity,
$T_t$ is the liner thickness, and
$CD_{eff}$ is the effective width.

In one embodiment the simplified equation (i.e., equation (16) is sufficiently accurate, even when the inner material width dependent resistivity, ρ1, is not similar to the liner material bulk resistivity, ρ2. Consequently, the resistance for a BEOL structure can be determined based on the inner material width dependent resistivity, ρ1, the liner material bulk resistivity, ρ2, the height of the BEOL structure, H, the effective width, $CD_{eff}$, and the liner thickness, $T_t$. As noted above, in one embodiment, the inner material width dependent resistivity, ρ1, accounts for the width scatter effect.

Based upon the general total resistivity model of equation (16), a specific resistivity model can be derived for a particular foundry. The specific resistivity model includes constant coefficients that can be derived for each specific foundry or in the case manufacturing processes or processing conditions (e.g., film properties) significantly differ. The equation for the specific resistivity, $R_{specific}$, is as follows:

$$R_{specific} = a_2 \left( \frac{\rho_1 H}{\pi \left( r_{eff}^2 + (2r_{eff} + T_t)T_t \frac{\rho_1}{\rho_2} \right)} + \frac{\rho_2 T_t}{\pi (r_2 + T_t)^2} \right) + b_2 \quad (17)$$

$$= a_2 R_{total} + b_2$$

where ρ1 is the inner material width dependent resistivity,
H is the height of the BEOL structure,
ρ2 is the liner bulk resistivity,
$T_t$ is the liner thickness,
$r_{eff}$ is the effective radius,
$r_2$ is the bottom radius,
$a_2$ is a constant coefficient correlated to slope profile and process related information, and
$b_2$ is a constant coefficient correlated to material and interface resistance.

In one embodiment, the bottom radius, $r_2$, is approximated as the effective radius, $r_{eff}$. In this case the following simplified equation can be used (especially when the inner material width dependent resistivity, ρ1, is close to the liner material bulk resistivity, ρ2:

$$R_{specific} \approx a_3 \left( \frac{\rho_1 H + \rho_2 T_t}{CD_{eff}^2} \right) + b_3 \quad (18)$$

(if $\rho_1 \approx \rho_2$)

where ρ1 is the inner material width dependent resistivity,
H is the height of the BEOL structure,
ρ2 is the liner bulk resistivity,
$T_t$ is the liner thickness,
$CD_{eff}$ is the effective width,
$a_3$ is a constant coefficient correlated to slope profile and process related information, and
$b_3$ is a constant coefficient correlated to material and interface resistance.

It is noted that even when the inner material width dependent resistivity, ρ1, is not close to the liner material bulk resistivity, ρ2, the resulting error is small, based upon actual data analysis. However, in some applications such as when scaling to smaller dimensions, it may be desirable to use equation (17) (i.e., non-simplified version).

Figure 5:
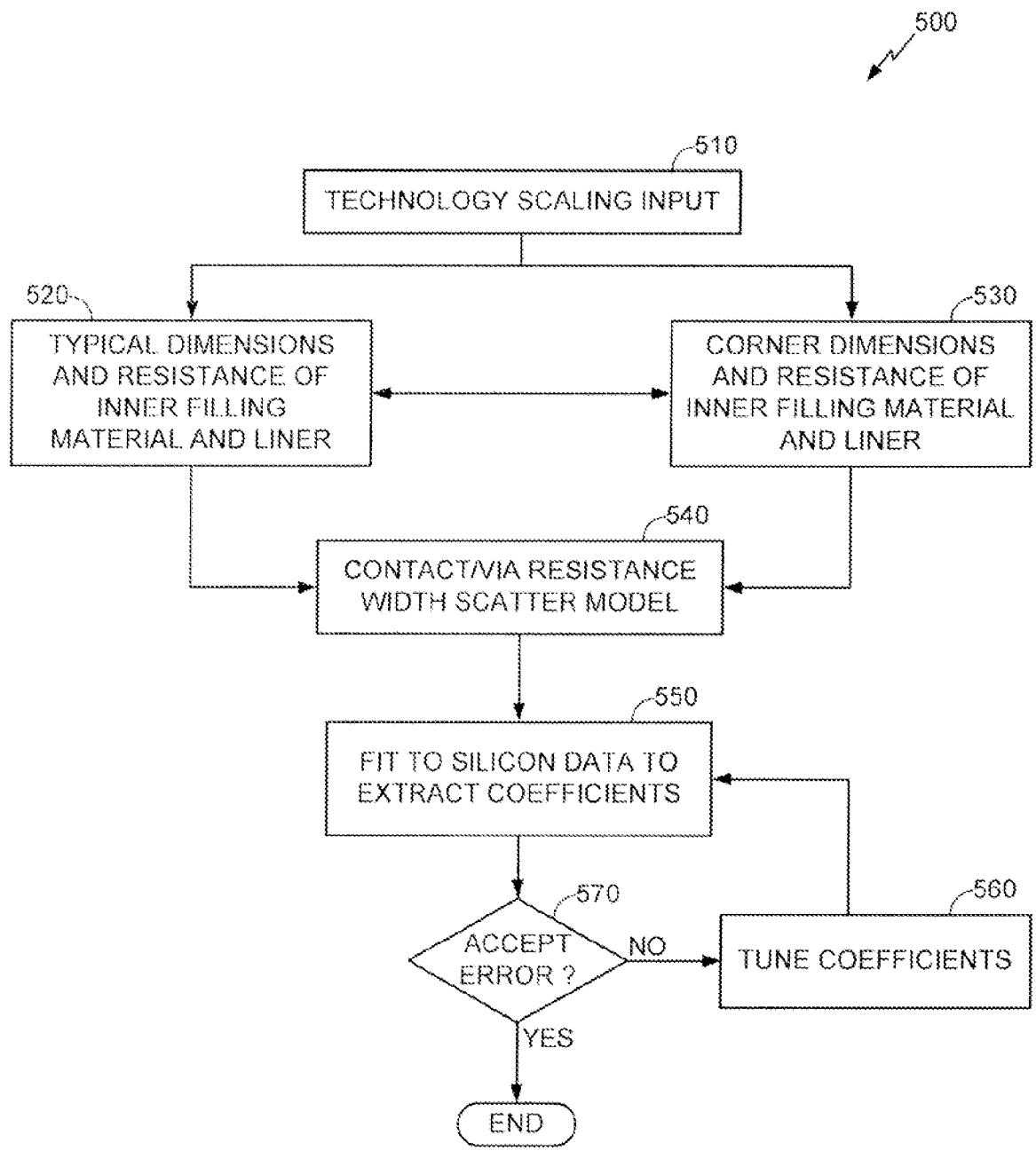
FIG. 5 is a block diagram illustrating an exemplary flow for modeling a back end of line (BEOL) structure.

Derivation of the coefficient values $a_2$, $a_3$, $b_2$, $b_3$ will now be explained with reference to the process 500 of FIG. 5.

Initially, at block 510 general technology scaling information is input. For example, the general dimensions and material are received. Then, at block 520 typical dimensions, such as thickness and other dimensions of the BEOL structure, as well as the typical resistance information of the inner and outer materials are received. At block 530 corner information of the thickness and other dimensions of the BEOL structure, as well as the corner resistance information of the inner and outer materials are received.

At block 540 the inner material width dependent resistivity, ρ1, is determined. Then, at block 550 the coefficients $a_2$, $a_3$, $b_2$, $b_3$ are extracted based upon actual past data (e.g., silicon data). That is, actual data is used to fit the equation. If the error is determined to be unacceptable at block 570, the coefficients are tuned at block 560, and the process returns to block 550. If the error is acceptable (less than 5%-10% in one embodiment), at block 570, the process ends.

Thus, according to an aspect of the present disclosure a methodology for extracting analytical models for scaling BEOL structures (such as a contact or via) considers a liner width, the width scatter effect, and the slope profile of the BEOL structure. A general model can be fitted for particular foundries based on actual foundry data. Once fitted, different input conditions (e.g., different height or liner thickness, etc.) can be provided for different BEOL structures and the expected resistance of the BEOL structures can be predicted. Thus, the effects of various changes to the BEOL structure can be predicted, i.e., contact and via variability studies are enabled as technology scales.

Some advantages to take note from the analytical representation of the projection model are that multiple foundries (or semiconductor fabrication vendors) may adopt the projection model to either define or provide production input parameters for the production (or fabrication) of interconnect structures. The projection model can provide data points representative of design trends and/or performance trends for interconnects in technology nodes not yet in production or in researching stages. Therefore, production delays for the design and development of integrated circuits are substantially eliminated.

The model can calculate one or more data points of performance values. In particular embodiments, the data points may be visually presented, such as with plots, tables, matrices, charts, or other types of visually presented processed data. The data points can present trends in design and performance for experimental interconnects in technology nodes projected for development. Although the model is derived from existing wafer data, delays in modeling proposed interconnect designs or interconnect technology is reduced or eliminated.

As a result of applying the model, estimates in propagation delay of experimental interconnect design choices can be provided, even in advanced technology nodes. In other words, it can be seen how variations in dimension and material composition affect interconnect behavior. In some instances, the results may include alternative designs with proposed physical dimensions to produce a specific performance, such as to lower power consumption or lower propagation delay. Of course, there may be alternative ways to display the results. The model may also update the results substantially concurrently with the receipt of new input data, such as physical dimensions, to provide a timely response without the need to generate a new model when new input data is available. This reduces the amount of time needed to run on-chip interconnect simulations early in the development cycle of integrated circuits.

The model provides a quick estimation of interconnect behavior beyond existing nodes and provides an accurate picture of the effects on performance by shrinking devices.

The model accounts for variations in width, which increase the resistance in shrinking devices. Although the model is derived from existing wafer data, thereafter the model simulates interconnects without using existing wafer data therefore not delaying the development cycle. The model, as configured, can be used by multiple foundries manufacturing interconnects with similar materials to explore their best suited options. In addition, the model can provide users with information on manufacturing optimized interconnects.

Figure 6:
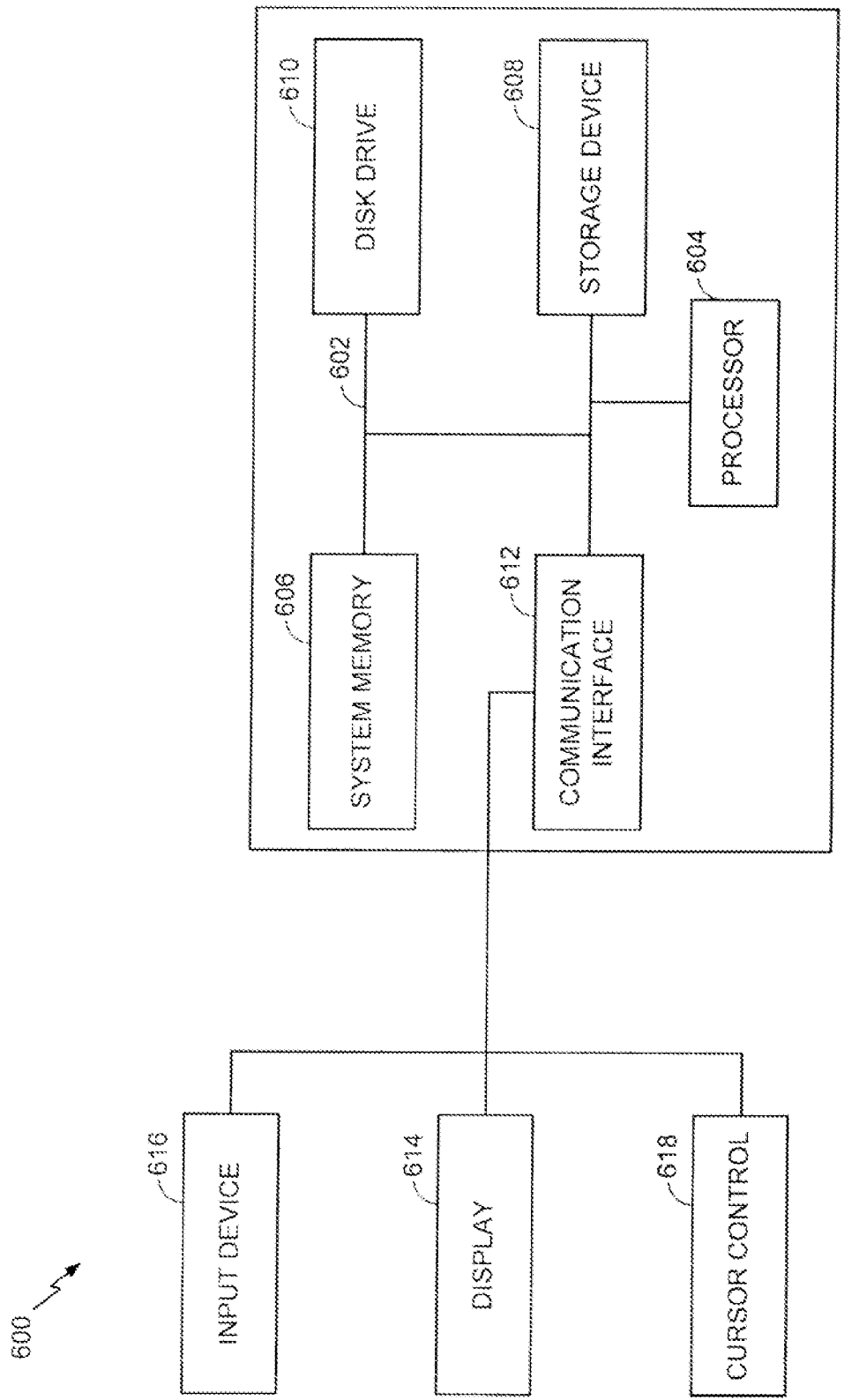
FIG. 6 is a diagram illustrating an exemplary computer system suitable for modeling a back end of line (BEOL) structure.

FIG. 6 is a diagram illustrating an exemplary computer system suitable for predicting interconnect behavior relative to technology scaling. The computer system 600 may be used to implement computer programs, applications, methods, processes, or other software to perform the above-described techniques. The computer system 600 includes a bus 602 or other communication mechanism for communicating information, which interconnects subsystems and devices, such as a processor 604, a system memory 606 (e.g., RAM), a storage device 608 (e.g., ROM), a disk drive 610 (e.g., magnetic or optical), a communication interface 612 (e.g., modem or Ethernet card), a display 614 (e.g., CRT or LCD), an input device 616 (e.g., keyboard), and a cursor control 618 (e.g., mouse or trackball).

The computer system 600 performs specific operations by the processor 604 executing one or more sequences of one or more instructions stored in the system memory 606. Such instructions may be read into the system memory 606 from another computer readable medium, such as the static storage device 608 or the disk drive 610. In some examples, hard-conductive traced circuitry may be used in place of or in combination with software instructions for implementation.

Moreover, execution of the sequences of instructions may be performed by a single computer system 600. According to some examples, two or more computer systems 600 coupled by a communication link (e.g., LAN, public switched telephone network, or conductive traceless network) may perform the sequence of instructions in coordination with one another. The computer system 600 may transmit and receive messages, data, and instructions, including program, i.e., application code, through the communication link and the communication interface 612. The processor 604 may execute received program code, stored program code as in a disk drive 610, or other non-volatile storage for later execution.

As will be appreciated by one skilled in the art, the present disclosure may be embodied as a system, method or computer program product. Accordingly, the present disclosure may take the form of an entirely hardware embodiment, an entirely software embodiment (including firmware, resident software, micro-code, etc.) or an embodiment combining software and hardware aspects that may all generally be referred to as a "circuit," "module" or "system." Furthermore, the present disclosure may take the form of a computer program product embodied in any tangible medium of expression having computer-usable program code embodied in the medium.

Any combination of one or more computer usable or computer readable medium(s) may be utilized. The term "computer readable medium" refers to any medium that participates in providing instructions to the processor for execution. The computer-usable or computer-readable medium may be, for example but is not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more conductive traces, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured by optically scanning the paper or other medium, then compiled, interpreted, or otherwise processed in a suitable manner, if necessary, and then stored in a computer memory.

Computer program code for carrying out operations of the present disclosure may be written in any combination of one or more programming languages, include an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to a external computer (for example, through the Internet using an Internet Service Provider). Although the foregoing examples have been described in some detail for purposes of clarity of understanding, the disclosure is not limited to the details provided. There are many alternative ways of implementing the disclosure. The disclosed examples are illustrative and not restrictive.

Although the present disclosure and its advantages have been described in detail, it should be understood that various changes, substitutions and alterations could be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. Any element in a claim that does not explicitly state "means for" performing a specified function, or "step for" performing a specified function, is not to be interpreted as a "means" or "step" clause as specified in 35 U.S.C. §112, ¶6. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such alternative environment and later developed processes, machines, manufacture, compositions of matter, means, methods, or steps.

What is claimed is:

1. A computer program product for predicting electrical characteristics of a back end of line (BEOL) structure of a semiconductor integrated circuit (IC), the computer program product being tangibly stored on a non-transitory computer-readable medium, comprising:
   code executing on a computer to predict electrical characteristics of the BEOL structure having multiple layers comprising:

an electrical resistance, R, of the BEOL structure based on input data specific to the multiple layers of the BEOL structure;
an electron scattering characteristic of an inner filling material of the BEOL structure; and
where R is based on:

$$R = \frac{4(\rho_1 H + \rho_2 T_t)}{\pi CD_{\mathit{eff}}^2}$$

where H is the height of the BEOL structure,
$T_t$ is the thickness of the outer liner,
$CD_{\mathit{eff}}$ is an average of a top effective width and a bottom effective width,
$\rho_1$ is width dependent resistivity of the inner filling material, and
$\rho_2$ is bulk resistivity of the outer liner.

2. The computer program product of claim 1, in which the BEOL structure comprises a via.

3. The computer program product of claim 2, in which the multiple layers of the via comprise the inner filling material and an outer liner.

4. The computer program product of claim 3, in which the code accounts for a width scatter effect of the inner filling material.

5. The computer program product of claim 1, wherein the BEOL structure comprises a contact and in which the multiple layers of the contact comprise the inner filling material and an outer liner.

6. The computer program product of claim 5, in which the code accounts for a width scatter effect of the inner filling material.

7. A system for predicting electrical characteristics of a BEOL structure of a semiconductor integrated circuit (IC), comprising:
means for predicting resistance, R, of the BEOL structure based on input data specific to a plurality of layers of the BEOL structure;
means for predicting an electron scattering characteristic of an inner filling material of the BEOL structure; and
where R is based on:

$$R = \frac{4(\rho_1 H + \rho_2 T_t)}{\pi CD_{\mathit{eff}}^2}$$

where H is the height of the BEOL structure,
$T_t$ is the thickness of the outer liner,
$CD_{\mathit{eff}}$ is an average of a top effective width and a bottom effective width,
$\rho_1$ is width dependent resistivity of the inner filling material, and
$\rho_2$ is bulk resistivity of the outer liner.

8. The system of claim 7, in which the BEOL structure comprises a via.

9. The system of claim 7, in which the BEOL structure comprises a contact.

10. The system of claim 7, in which the electron scattering predicting means accounts for a width scatter effect of one of the layers.

11. The system of claim 7, in which the resistance predicting means accounts for a slope profile of the BEOL structure.

12. A computer program product for predicting electrical characteristics of a back end of line (BEOL) structure of a semiconductor integrated circuit (IC), the computer program product being tangibly stored on a non-transitory computer-readable medium, comprising:
code executing on a computer to predict electrical characteristics of the BEOL structure having multiple layers comprising:
an electrical resistance, R, of the BEOL structure based on input data specific to the multiple layers of the BEOL structure;
an electron scattering characteristic of an inner filling material of the BEOL structure; and
where R is based on:

$$R = \frac{\rho_1 H}{\pi\left(r_{\mathit{eff}}^2 + (2r_{\mathit{eff}} + T_t)T_t\frac{\rho_1}{\rho_2}\right)} + \frac{\rho_2 T_t}{\pi(r_2 + T_t)^2}$$

where H is the height of the BEOL structure,
Tt is the thickness of the outer liner,
reff is an average of a top radius and a bottom radius,
r2 is a bottom radius,
ρ1 is width dependent resistivity of the inner filling material, and
ρ2 is bulk resistivity of the outer liner.

13. The computer program product of claim 12, in which the BEOL structure comprises a via.

14. The computer program product of claim 13, in which the multiple layers of the via comprise the inner filling material and an outer liner.

15. The computer program product of claim 14, in which the code accounts for a width scatter effect of the inner filling material.

* * * * *